(12) United States Patent
Hatsuda et al.

(10) Patent No.: US 8,076,437 B2
(45) Date of Patent: Dec. 13, 2011

(54) ENCAPSULANT MATERIAL FOR OPTICAL COMPONENT AND LIGHT-EMITTING DEVICE

(75) Inventors: Kouki Hatsuda, Tochigi (JP); Hiroshi Samukawa, Tochigi (JP); Katsuhiko Komuro, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 228 days.

(21) Appl. No.: 12/440,503

(22) PCT Filed: Jun. 9, 2008

(86) PCT No.: PCT/JP2008/060540
§ 371 (c)(1),
(2), (4) Date: Mar. 9, 2009

(87) PCT Pub. No.: WO2009/019931
PCT Pub. Date: Feb. 12, 2009

(65) Prior Publication Data
US 2010/0059774 A1    Mar. 11, 2010

(30) Foreign Application Priority Data
Aug. 7, 2007  (JP) ................................ 2007-205939

(51) Int. Cl.
*C08G 77/00* (2006.01)
(52) U.S. Cl. ........................ 528/10; 528/42; 106/287.11
(58) Field of Classification Search ........................ 528/10
See application file for complete search history.

(56) References Cited

U.S. PATENT DOCUMENTS

| | | | | |
|---|---|---|---|---|
| 3,981,848 A | * | 9/1976 | Limburg ........................ | 525/295 |
| 5,414,069 A | * | 5/1995 | Cumming et al. ............ | 528/310 |
| 2004/0072981 A1 | * | 4/2004 | Salamone et al. ............ | 528/10 |
| 2004/0236057 A1 | * | 11/2004 | Chevalier et al. ............. | 528/42 |
| 2008/0070333 A1 | * | 3/2008 | Morita et al. ................. | 438/26 |

FOREIGN PATENT DOCUMENTS

| | | |
|---|---|---|
| JP | 62-127321 A | 6/1987 |
| JP | 63-199736 A | 8/1988 |
| JP | 2-127432 A | 5/1990 |
| JP | 6-256520 A | 9/1994 |
| JP | 2002-317048 A | 10/2002 |
| JP | 2005-100710 A | 4/2005 |
| JP | 2008-138207 A | 6/2008 |
| WO | 2004/082362 A2 | 9/2004 |
| WO | 2005/019307 A1 | 3/2005 |
| WO | 2005/019308 A1 | 3/2005 |
| WO | 2005/096408 A1 | 10/2005 |

OTHER PUBLICATIONS

International Search Report w/translation from PCT/JP2008/060540 dated Sep. 9, 2008 (4 pages).
espacenet.com Abstract JP2002317048A; Publication Date Oct. 31, 2002; Kanegafuchi Chemical Ind. (1 page).
International Preliminary Report on Patentability with English Translation issued for PCT/JP2008/060540 dated Mar. 4, 2010 (5 pages).

* cited by examiner

*Primary Examiner* — Randy Gulakowski
*Assistant Examiner* — Lindsay Nelson
(74) *Attorney, Agent, or Firm* — Osha • Liang LLP

(57) ABSTRACT

A light-emitting device is provided which uses an encapsulant material made from a polymer having a high relative light output. The light-emitting device includes a light-emitting element and a member sealing the light-emitting element. The encapsulant material has one or more than two kinds of units given by the following formula (1) and a refractive index of 1.55 or more.

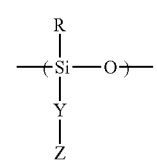

(1)

where R is a hydrogen atom, alkyl group or phenyl group, Y is an alkyl group of which the carbon number is 1 to 6 or an alkyloxy group of which the carbon number is 1 to 6 and Z is an aromatic compound that meets predetermined requirements.

9 Claims, 5 Drawing Sheets

ENCAPSULANT MATERIAL FOR OPTICAL COMPONENT AND LIGHT-EMITTING DEVICE

TECHNICAL FIELD

The present invention relates to an optical component encapsulant material having color fastness, heat resistance and a high relative light output, and a light-emitting device.

This application claims the priority of the Japanese Patent Application No. 2007-205939 filed in the Japanese Patent Office on Aug. 7, 2007, the entirety of which is incorporated by reference herein.

BACKGROUND ART

LEDs (light-emitting diode) have lately been used widely as an illuminator, light source for a projector, backlight of liquid crystal television, etc. Since the LED dissipates no excessive heat and has an overwhelmingly long life, it attracts more attention because of its possibility of replacing the fluorescent lamp in future. Among others, the practical application of the blue LED has led to development of LED-based signals, full-color LED display devices, etc. and such LED-based products have rapidly become popular. Along with such prevalence of the LED products, it is more and more demanded to improve the performance of the LED.

There is disclosed in the Japanese Published Unexamined Patent Application No. 2002-80733 (Patent Document 1), for example, an LED encapsulant material made from a composition containing, as critical components, an organic compound made up of an organic skeleton containing at least two carbon-carbon double bonds reactive with SiH group in one molecule, a silicide compound containing at least two SiH groups in one molecule and a hydrosilylated catalyst and which thus has a high heat resistance, low birefringence, small photoelastic coefficient, improved transparency and high toughness.

Also there is disclosed in the Japanese Published Unexamined Patent Application No. 2002-317048 (Patent Document 2), for example, an LED encapsulant material made from an aliphatic organic compound having at least two carbon-carbon double bonds reactive with SiH group and one to six vinyl groups and of which the molecular weight is under 900 and viscosity is under 1000 P (poises), a hardener produced by hydrosilylating a chain and/or cyclic polyorganosiloxane having at least two SiH groups and which thus has at least two SiH groups or an organic compound given by the following formula (1), and a hardenable compound produced by hydrosilylating a cyclic polyorganosiloxane having at least two SiH groups and which thus has at least two SiH groups:

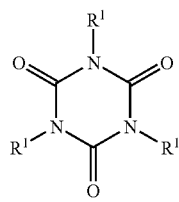

(1)

where $R^1$ indicates a univalent organic group whose carbon number is 1 to 50; these $R^1$ may be different from or equal to each other.

DISCLOSURE OF THE INVENTION

Problems to be Solved by the Invention

Among the demands for improved performances of the LED-based light-emitting device (will be referred to as "LED device" hereafter), the one for higher luminance is growing. For higher luminance of the LED device, it is necessary to improve the relative light output of an encapsulant material for the LED device.

In FIG. 1, there is shown the relation between the refractive index and relative light output (%) of an encapsulant material for a commercial LED device in which sapphire (of which the refractive index n=1.76) is used as the substrate of an LED chip. In FIG. 1, each of points $P_1$, $P_2$, $P_3$ and $P_4$ indicate a relative light output (%) plotted in relation to the refractive index of the commercial encapsulant material in the LED device in case the relative light output for the refractive index (n=1.76) of the sapphire substrate is taken as 100%. As shown in FIG. 1, the relative light output of an encapsulant material is nearly proportional to the refractive index n of the encapsulant material and as the refractive index n is higher, the relative light output (%) is higher. Generally, in a linear range between $P_3$ and $P_4$, the relative light output of an encapsulant material made from a commercial silicone (will be referred to as "polysiloxane" hereafter) is 60 to 75% for a refractive index of 1.4 to 1.5. For a high relative light output between $Q_1$ and $Q_2$, the encapsulant material should desirably be made from a polymer having a high refractive index, for example.

One of the methods of increasing the refractive index of an encapsulant material is to introduce a benzene ring into the side chain of a polymer used to form the encapsulant material, for example. In this case, the polymer has a high refractive index but drastically turns yellow. Among others, acrylic resin is easily decomposed since it has an ester bond and carbonyl group. On the other hand, a polysiloxane being a polymer having a siloxane bond as the skeleton is not easily decomposed because it has a large bonding energy of Si—O (Si—O: 444 kJ/mol). However, even a polysiloxane having a phenyl group introduced in the side chain thereof is transparent but low in refractive index.

FIG. 2 shows the relation between heat resistance, light resistance and refractive index of an acrylic resin ($S_1$), epoxy resin ($S_2$), polyphenylmethylsiloxane ($S_3$) and polydimethylsiloxane ($S_4$) each as an encapsulant material to be used in the conventional LED device. As shown in FIG. 2, the acrylic resin ($S_1$) and the epoxy resin ($S_2$) are high in refractive index but inferior in heat resistance and light resistance, while the polyphenylmethylsiloxane ($S_3$) and polydimethylsiloxane ($S_4$) are superior in heat resistance and light resistance but low in refractive index.

It is therefore desirable to overcome the above-mentioned drawbacks of the related art by providing an optical component encapsulant material having a high color fastness, heat resistance and relative light output and a light-emitting device.

According to an embodiment of the present invention, there is provided an optical component encapsulant material made from a polymer having one or more than two kinds of units given by the following formula (2) and a refractive index of 1.55 or more:

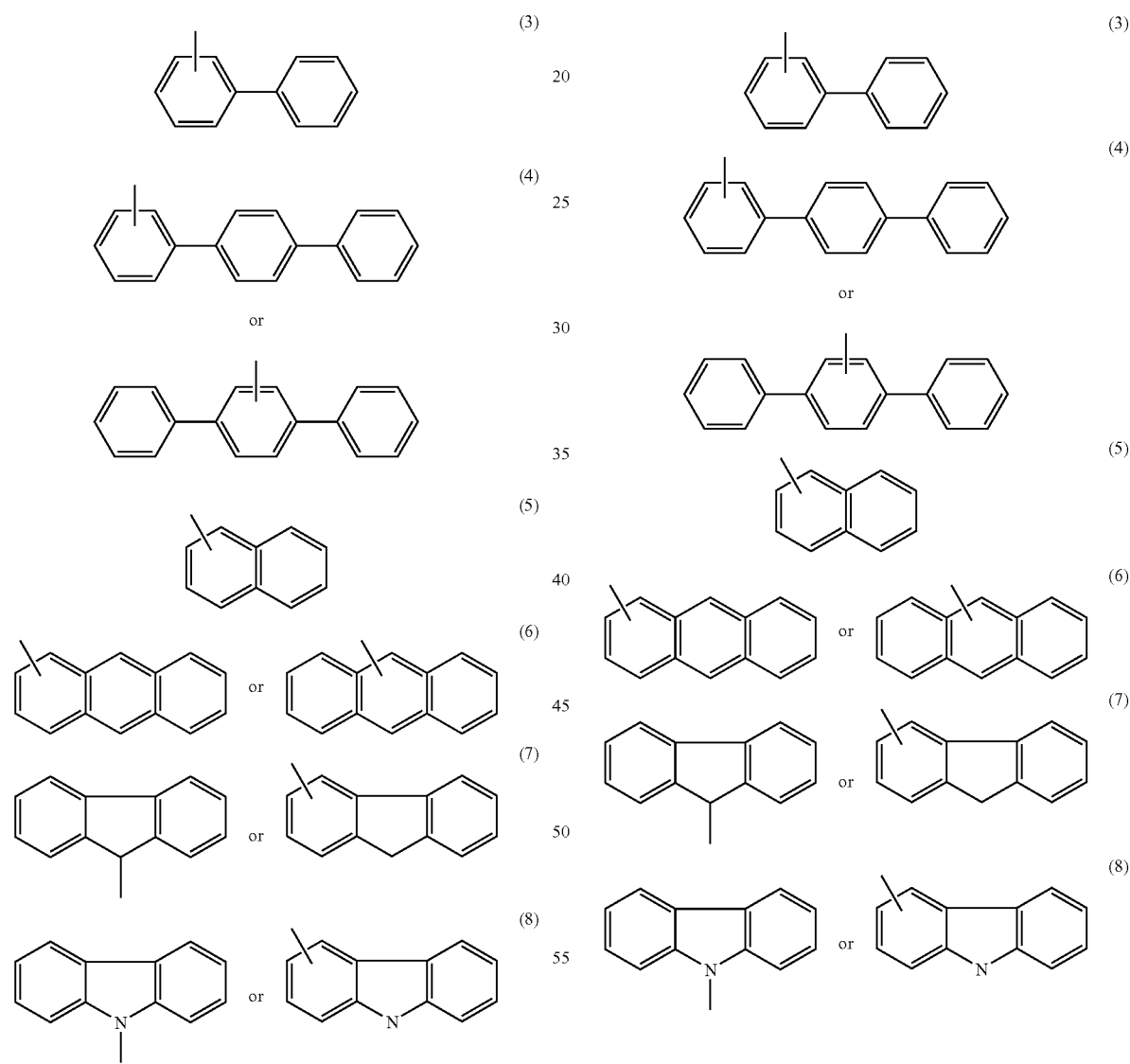

where R is a hydrogen atom, alkyl group or phenyl group, Y is an alkyl group of which the carbon number is 1 to 6 or an alkyloxy group of which the carbon number is 1 to 6 and Z is one of functional groups given by the following formulas (3) to (8) in which Z can be bonded to Y in all possible positions:

According to another embodiment of the present invention, there is provided a light-emitting device including a light-emitting element and a member sealing the light-emitting element, the encapsulant material made from a polymer having one or more than two kinds of units given by the following formula (2) and a refractive index of 1.55 or more:

The foregoing and other features, aspects and advantages of the present invention will become more apparent from the following detailed description of embodiments of the present invention when taken in conjunction with the accompanying drawings. It should be noted that the present invention is not limited to the embodiments but can freely be modified without departing from the scope and concept thereof defined in the claims given later.

BEST MODE FOR CARRYING OUT THE INVENTION

The present invention will be described in detail below concerning embodiments thereof with reference to the accompanying drawings.

Figure 1:
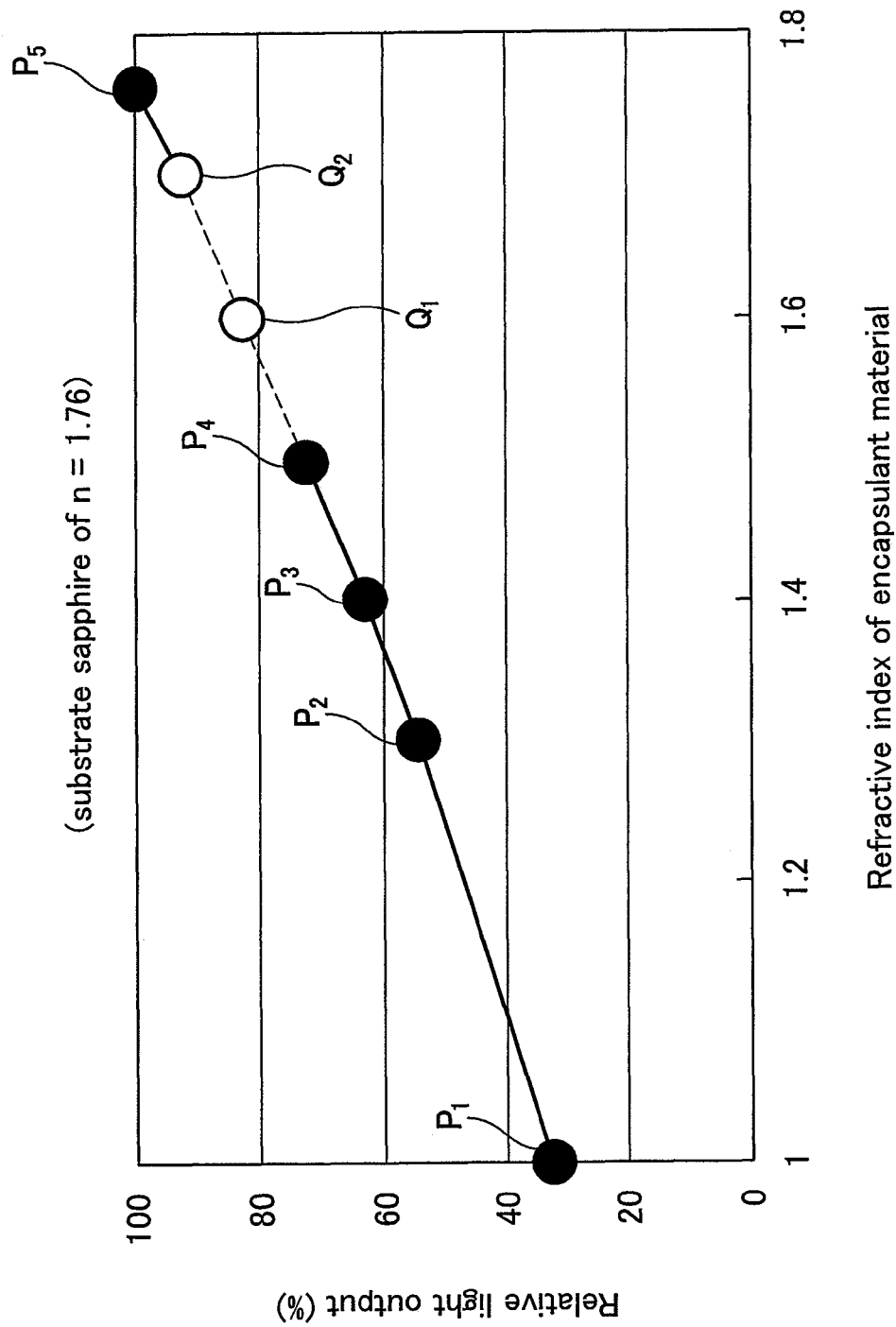
FIG. 1 shows the relation between the refractive index and relative light output (%) of an encapsulant material (polysiloxane) in a commercial LED device.
Figure 2:
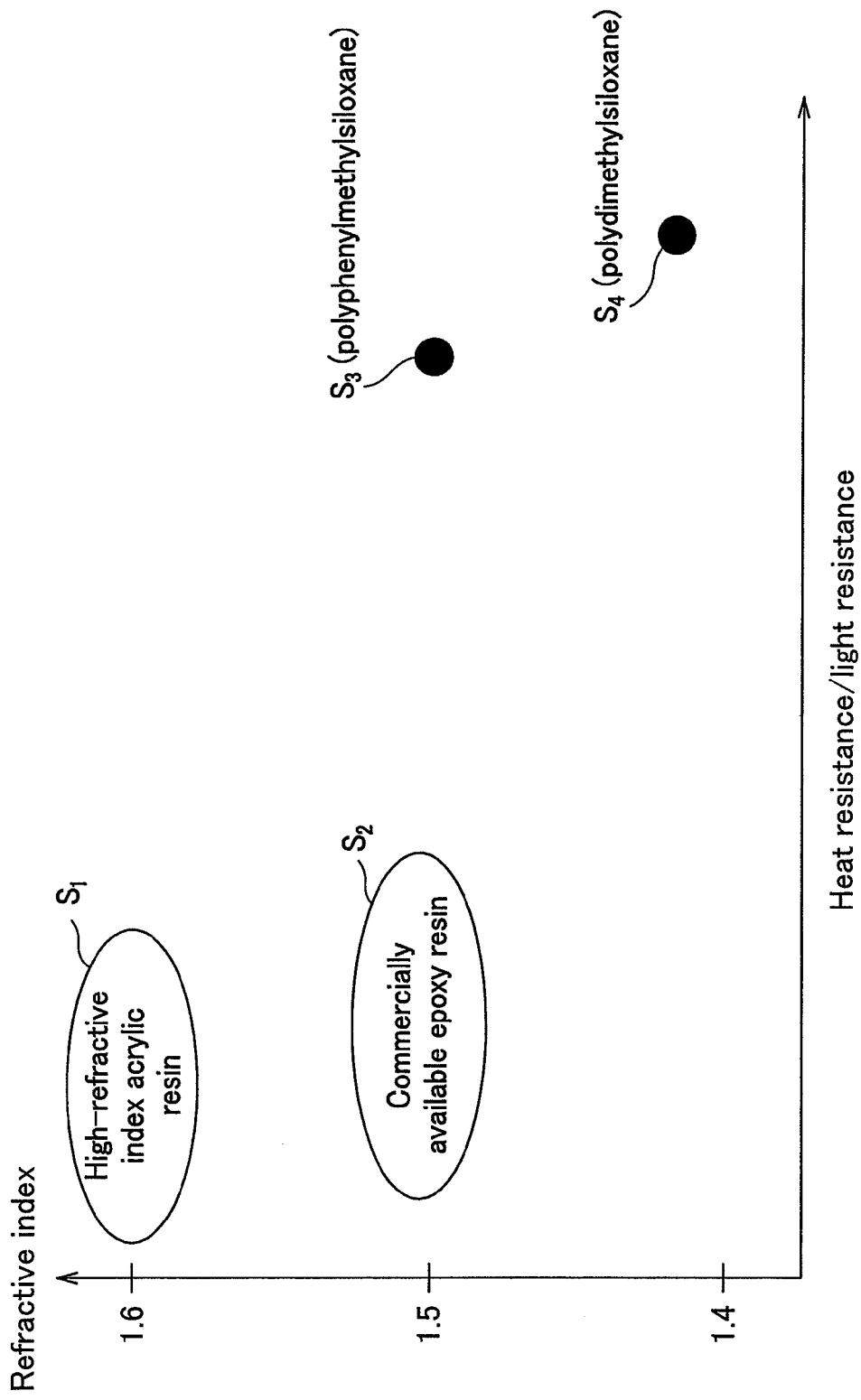
FIG. 2 shows the relation between heat resistance, light resistance and refractive index of an acrylic resin, epoxy resin, polyphenylmethylsiloxane and polydimethylsiloxane each as an LED encapsulant material.
Figure 3:
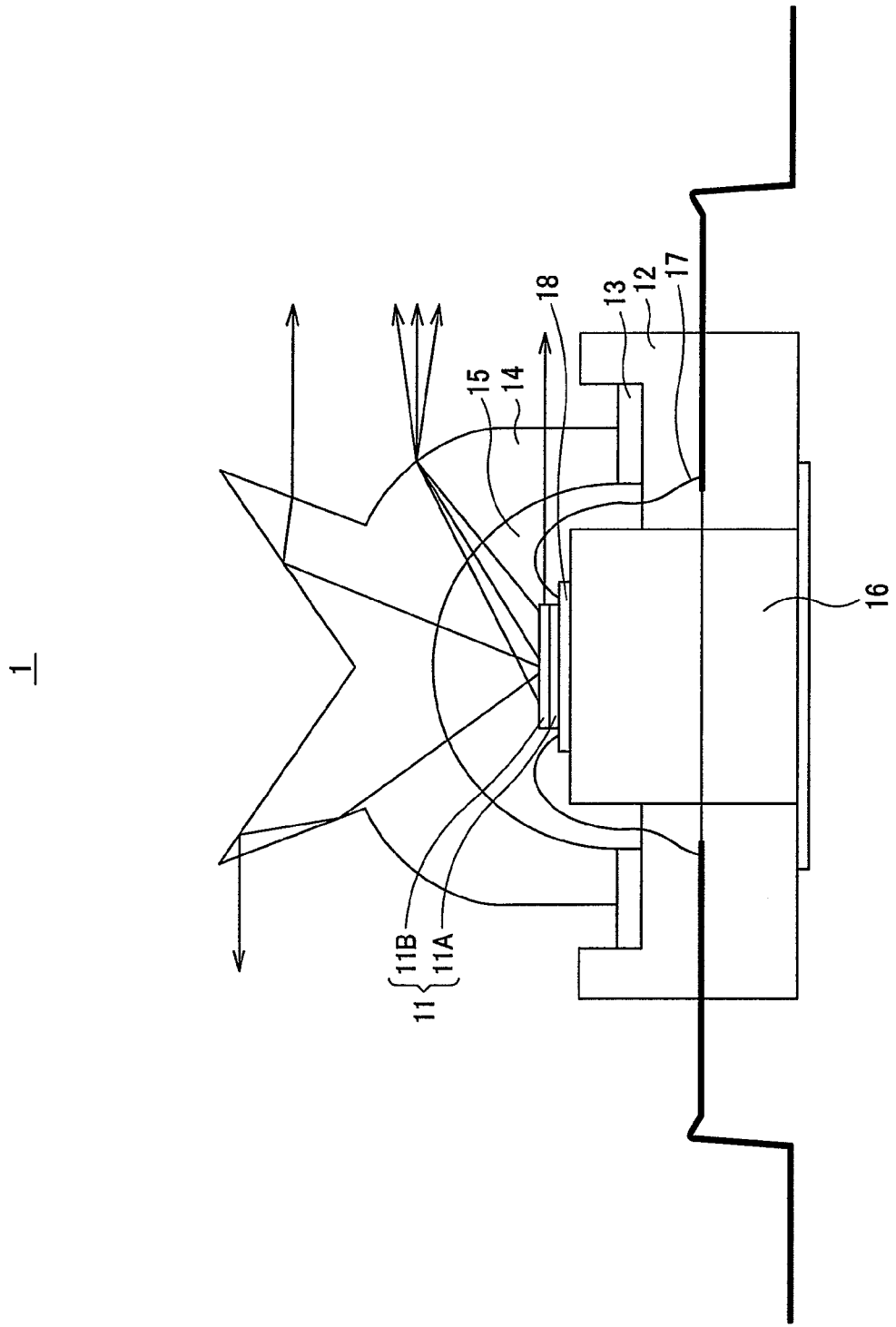
FIG. 3 shows the construction of a light-emitting device according to an embodiment of the present invention.

Referring now to FIG. 3, there is schematically illustrated an example of the light-emitting device according to an embodiment of the present invention. The light-emitting device, generally indicated with a reference numeral 1, includes an LED (light-emitting diode) chip 11, base 12, adhesive layer 13, frame 14 joined to the base 12 via the adhesive layer 13 being laid between them to surround the LED chip 11 and which functions as a lens, encapsulant material 15 formed by filling a sealing material in the frame 14 which serves as a lens (will be referred to as "lens frame" hereafter), member 16, electroconductive gold wire 17 and an electroconductive substrate 18.

The LED chip 11 is a light-emitting element including a light-emitting layer 11A made from InGaN and a sapphire substrate 11B mounted on the light-emitting layer 11A with a low-temperature buffer layer (not shown), for example, being laid between them. The LED chip 11 emits royal-blue light of 440 to 460 nm in wavelength, for example. Also, in the LED chip 11, the light-emitting layer 11A is mounted at the bottom thereof on the electroconductive substrate 18 with a solder layer (not shown) of In etc., for example, being laid between them. Also, the LED chip 11 is joined to the base 12 with the gold wire 17 being laid between them.

The base 12 is made from an insulative material such as plastic or the like. The adhesive layer 13 may be made from one selected from various materials which can join the lens frame 14 and base 12 to each other, such as UV-curing adhesive.

The lens frame 14 may be formed from a transparent material equal in coefficient of linear expansion to the material of the encapsulant material 15. In this embodiment, the lens frame 14 is formed from a cyclic olefin copolymer (COC) superior in heat resistance and strength and having a high light transmittance. However, it should be noted that an embodiment of the present invention is not limited to this material but the lens frame 14 may be formed from one selected from various materials having such properties. Also, the lens frame 14 is designed to direct the light from the substrate 11B generally horizontally as indicated by arrows in FIG. 3.

The member 16 may be made from a material having high heat conduction, insulation performance, heat resistance and other superior properties as well as being capable of preventing the LED chip 11 from being damaged due to a difference in thermal expansion between the LED chip 11 and heat-dissipating portion. For example, AlN or the like, which is relatively high in thermal conduction and electrically insulative, may be selected as the material, but it should be noted that an embodiment of the present invention is not limited to such a material.

The electroconductive substrate 18 has the LED chip 11 mounted thereon as shown. The electroconductive substrate 18 is made from AlN. However, it should be noted that an embodiment of the present invention is not limited to AlN but the material of the electroconductive substrate 18 may be made from a material which is relatively high in thermal conduction, such as SiC, Si or the like.

Note that the LED chip 11 and electroconductive substrate 18 may be joined to each other with a solder of SnPb, AuSn, SnAgCu or the like or a paste of Ag or the like, for example, and more preferably with a solder containing no lead (Pb), such as AuSn, SnAgCu or the like.

According to this embodiment, the encapsulant material 15 is made from a material capable of putting a high-luminance LED device into practice. That is, the sealing material should preferably be a polymer having color fastness, heat resistance and a high relative light output (high refractive index).

Figure 4A:
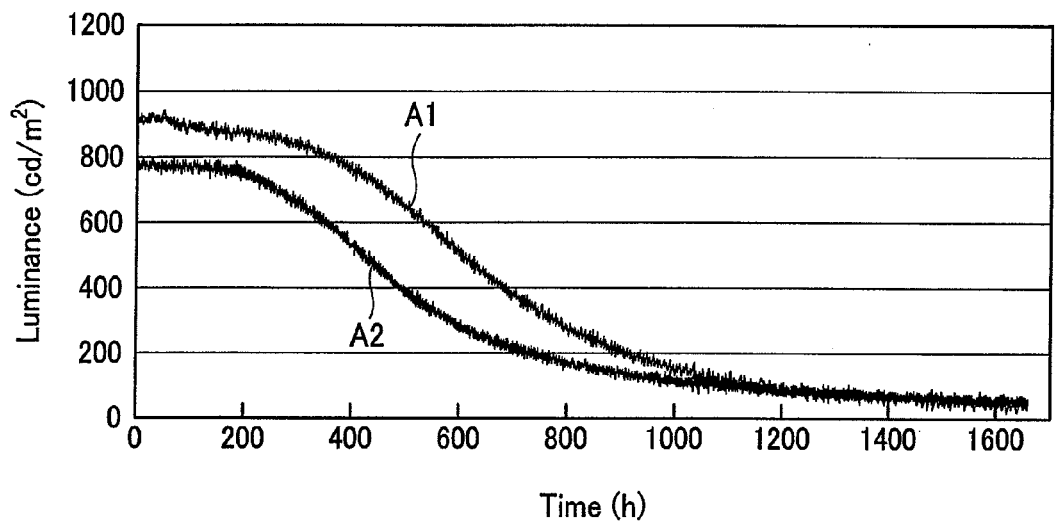
FIG. 4A shows an example of the change in luminance of a royal-blue LED provided with an encapsulant material formed from an epoxy resin.
Figure 4B:
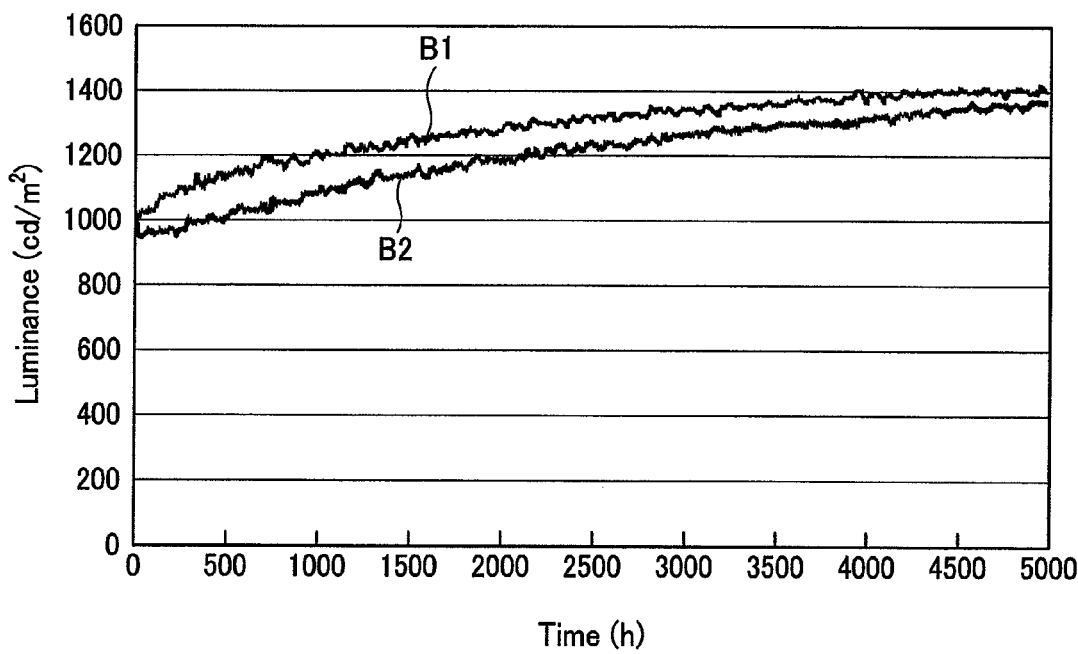
FIG. 4B shows an example of the change in luminance of a royal-blue LED provided with an encapsulant material formed from a polysiloxane.

FIG. 4A shows an example of the change in luminance of a royal-blue LED (at 350 mA and 85° C.) sealed by a member formed from an epoxy or urethane resin, and FIG. 4B shows an example of the change in luminance of a royal-blue LED (at 350 mA and 85° C.) sealed by a member formed from a polysiloxane. In FIG. 4A, A1 indicates the luminance change of the royal-blue LED sealed by an epoxy resin (NLD-SL-1107 by SANYU REC CO., LTD.) of which the refractive index is 1.49, and A2 indicates the luminance change of the royal-blue LED sealed by a urethane resin (H-7E11-1 by DAI-ICHI KOGYO SEIYAKU CO., LTD.) of which the refractive index is 1.48. In FIG. 4B, B1 indicates the luminance change of the royal-blue LED sealed by a polydimethylsiloxane (CY52-276 by TORAY DOW) of which the refractive index is 1.41, and B2 indicates the luminance change of the royal-blue LED sealed by a polyphenylmethylsiloxane (XE14-C1389 by TOSHIBA GE) of which the refractive index is 1.53.

As will be known from FIGS. 4A and 4B, the luminance of the royal-blue LED sealed by the epoxy or urethane resin, for example, is lower as the time elapses, while that of the royal-blue LED sealed by the polysiloxane is not lower even with time elapse. Also, the acrylic resin has an easily decomposable structure having a carbonyl group and ester bond, while the polysiloxane has an extremely stable structure in which the bonding energy of Si—O is as large as 444 kJ/mol, is highly transparent as compared with the acrylic resin and will not turn yellow.

Thus, the encapsulant material 15 in this embodiment is made from a polysiloxane which takes siloxane bond as the skeleton. This sealing material should have a functional group containing an aromatic moiety in the side chain thereof.

The material of the encapsulant material 15 should preferably have a high relative light output. The relative light output is proportional to the refractive index of a polymer. For a high relative light output, there should be designed a polymer having a high refractive index. For a high relative light output of the light-emitting device 1, the refractive index of the material of the encapsulant material 15 should be approximate to that of the substrate 11B. More particularly, since the refractive index of the sapphire forming the substrate 11B is 1.74, the refractive index of the material of the encapsulant material 15 should be approximate to that (1.74) of the sapphire. On this account, various functional groups are introduced as side chain into the polysiloxane main chain for the refractive index of the material of the encapsulant material 15 to be higher than 1.55, which is higher than ever, more preferably, 1.55 to 1.65.

The material used to form the encapsulant material 15 may be a polymer having one or more than two kinds of units given by the formula (2):

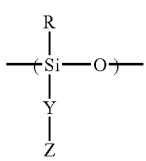

(2)

where R is a hydrogen atom, alkyl group or phenyl group, Y is an alkyl group of which the carbon number is 1 to 6 or an alkyloxy group of which the carbon number is 1 to 6, one of —(CH$_2$)$_n$—, —(CH$_2$)$_n$—O— and the like wherein n=1 to 6 being selectable as Y, and Z is one of functional groups given by the following formulas (3) to (8) in which Z can be bonded to Y in all possible positions:

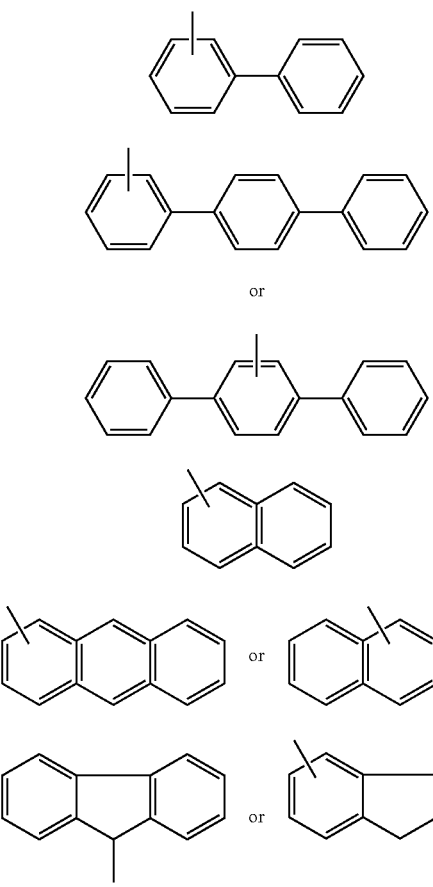

(3)

(4)

or (5)

(6)

or (7)

or

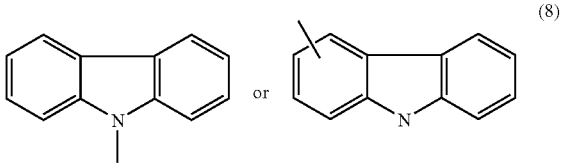

(8)

Tables 1 and 2 show relations between comonomer content (%) and refractive index of a polydiphenylsiloxane-polydimethylsiloxane copolymer having a structure given by the following formula (9) and a polyphenylmethylsiloxane-polydimethylsiloxane copolymer having a structure given by the following formula (10), respectively. It will be known from Tables 1 and 2 that as the comonomer content (%) is larger, the refractive index of the copolymer is higher. It will thus be seen that in a polymer having a siloxane structure, as the content (%) of phenyl group in the side chain is larger, the refractive index of the polymer is higher.

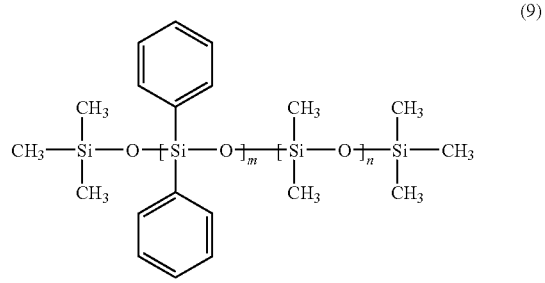

(9)

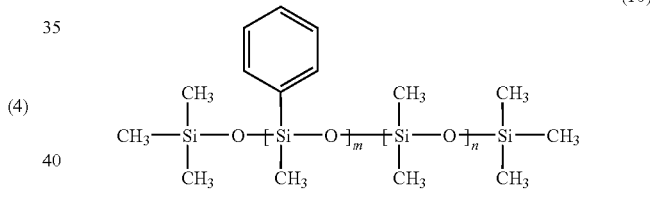

(10)

TABLE 1

| Comonomer content (%) | Refractive index |
| --- | --- |
| 4 to 6 | 1.42 |
| 7 to 10 | 1.44 |
| 18 to 22 | 1.49 |

TABLE 2

| Comonomer content (%) | Refractive index |
| --- | --- |
| 8 to 12 | 1.43 |
| 45 to 50 | 1.50 |

As will be known from Table 2, a polyphenylmethylsiloxane-polydimethylsiloxane copolymer containing comonomer in 45 to 50% and of which the refractive index is 1.50 is adopted as a material of the encapsulant material 15 in this embodiment.

As mentioned above, as the polysiloxane has an increased number of the aromatic rings in the side chain thereof, the polymer refractive index is higher. It should be noted however that the number of the aromatic rings the polysiloxane used to form the encapsulant material 15 has in the side chain should necessary be 1 to 3 in the units of the polysiloxane. If the number of aromatic rings in the units of the polysiloxane is 4 or more, the polysiloxane turns yellow and is not suitable for use to form an encapsulant material which should be highly transparent.

Example

There will be explained how to synthesize and cure a polymer used to form the encapsulant material 15 with reference to a working example of the present invention. In this example, a polymethyl(allyletherbiphenyl-pendant)siloxane given by the following reaction formula (11) and polymethyl (allylcarbazole-pendant)siloxane given by the following reaction formula (12) are synthesized as will be described below.

The reaction formula (11) indicates the reaction taking place in production of a polymethyl(allyletherbiphenyl-pendant)siloxane from a polyhydromethylsiloxane and allyletherbiphenyl, and the reaction formula (12) indicates the reaction taking place in production of a polymethyl(allylcarbazole-pendant)siloxane from a polyhydromethylsiloxane and allylcarbazole.

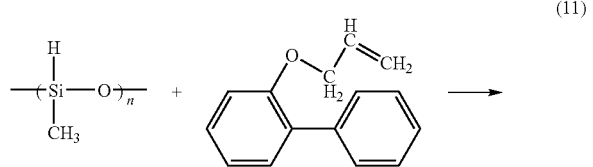

(11)

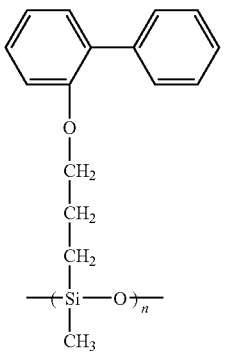

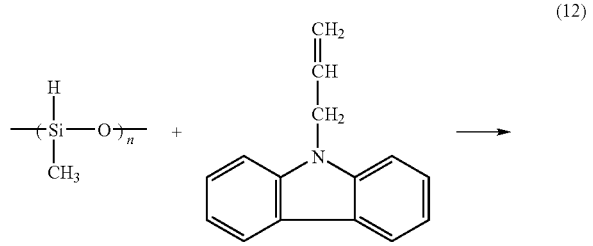

(12)

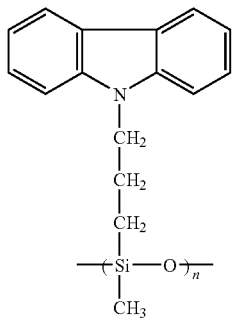

Synthesis of Allyletherbiphenyl

First an agitator and cooling tube were set in a three-neck flask having a capacity of 500 mL. Into the three-neck flask, there were put 12.74 g of 2-hydroxybiphenyl (70 mmol by TOKYO CHEMICAL INDUSTRY, CO., LTD.), 13.72 g of kalium carbonate (70 mmol), 8.5 g of allylbromide (70 mmol by TOKYO CHEMICAL INDUSTRY, CO., LTD.) and 200 g of dimethylacetoamide (by WAKO PURE CHEMICAL INDUSTRIES, LTD.). These ingredients were agitated at 80° C. for 10 hours. After the agitation, clear supernatant liquid was taken and the solvent was distilled away by an evaporator. Next, the liquid was dissolved in toluene, washed with a NaOH aqueous solution, and then distilled under a reduced pressure to provide a transparent and colorless liquid (of 20 mPa·s in viscosity at room temperature). The liquid was analyzed using an FT-IR (Fourier Transform Infrared Spectrometer, JASCO FT/IR-460 Plus). As a result, it was known that the liquid was a biphenylether in which the —OH group of 2-hydroxybiphenyl was allyletherified. The liquid had a purity of 97.5%.

Synthesis of polymethyl(allyletherbiphenyl-pendant)siloxane

First an agitator and a cooling tube were set in a three-neck flask of 300 mL in capacity. Into the three-neck flask, there were put 100 g of toluene, 50 mg of 2-propanol solution of chloroplatinic (of 5% by weight in concentration of chloroplatinic), 2.2 g of polyhydromethylsiloxane (Gelest HMS-993; 2200 in average molecular weight) and 7.6 g of allyletherbiphenyl. Then, the mixture was heated for 20 hours in a water bath kept at 60° C. while being agitated. The toluene solvent was distilled away under a reduced pressure by an evaporator to provide a transparent and colorless, viscous liquid (of 5 mPa·s in viscosity at room temperature). The liquid was analyzed using the FT-IR. The analysis showed that the Si—H peak (2171 cm$^{-1}$) disappeared. Also, the liquid was analyzed using $^1$H-NMR (Proton Nuclear Magnetic Resonance; Varian 300-MR). As a result, it was shown that a part of the Si—H group of siloxane had reacted with the allyletherbiphenyl.

Hardening of the polymethyl(allyletherbiphenyl-pendant) siloxane

First an agitator and a cooling tube were set in a three-neck flask of 300 mL in capacity. Into the three-neck flask, there were put 100 g of toluene, 50 mg of 2-propanol solution of chloroplatinic (of 5% by weight in concentration of chloroplatinic), 2.2 g of polyhydromethylsiloxane (Gelest HMS-993; 2200 in average molecular weight) and 6.8 g of allyletherbiphenyl. Then, the mixture was heated for 20 hours in a water bath kept at 60° C. while being agitated. Next, the toluene solvent was distilled away under a reduced pressure by an evaporator to provide a transparent and colorless, viscous liquid. The liquid was analyzed using the FT-IR, and the analysis proved that there existed only a small Si—H peak (2171 cm$^{-1}$). Also, the analysis showed that the peak would not completely disappear even when the liquid was further agitated and heated. Further it was found that heating the liquid with addition of a polyphenylmethylsiloxane having a vinyl group at either end thereof (Gelest PDV-03325) in 10% could result in gelling.

Synthesis of poly(allylcarbazole-pendant)siloxane

First an agitator and a cooling tube were set in a three-neck flask of 300 mL in capacity. Into the three-neck flask, there were put 100 g of toluene, 50 mg of 2-propanol solution of chloroplatinic (of 5% by weight in concentration of chloroplatinic), 2.2 g of polyhydromethylsiloxane (Gelest HMS-993; 2200 in average molecular weight) and 7.4 g of allylcarbazole (by Nippon Distillation Kogyo). Then, the mixture was heated for 20 hours in a water bath kept at 60° C. while being agitated. Next, it was reprecipitated in hexane to provide a white powder. Then, the liquid was analyzed using the FT-IR. As a result, it was shown that the Si—H peak (2171 cm$^{-1}$) disappeared. Also, the liquid was analyzed using the $^1$H-NMR, and the analysis proved that a part of the Si—H group of siloxane had reacted with the allylcarbazole.

The results of a variety of measurements made for the poly(allyletherbiphenyl-pendant)siloxane and poly(allylcarbazole-pendant)siloxane, synthesized as having been described above, will be described below.

Refractive index measurement of the poly(allyletherbiphenyl-pendant)siloxane and poly(allylcarbazole-pendant)siloxane An Abbe refractometer (DR-M2 by ATAGO CO., LTD.; 589 nm at 25° C.) was used to measure the refractive index of the poly(allyletherbiphenyl-pendant)siloxane and poly(allylcarbazole-pendant)siloxane, synthesized as above. The measured refractive index of the allyletherbiphenyl was 1.58, while that of the poly(allyletherbiphenyl-pendant)siloxane was 1.56. The refractive index of allylcarbazole is 1.67, but that of the synthesized poly(allylcarbazole-pendant)siloxane was 1.64 (measured by DSC at a glass transition temperature Tg of 52° C.).

Transmittance Measurement of the poly(allyletherbiphenyl-pendant)siloxane

Figure 5:
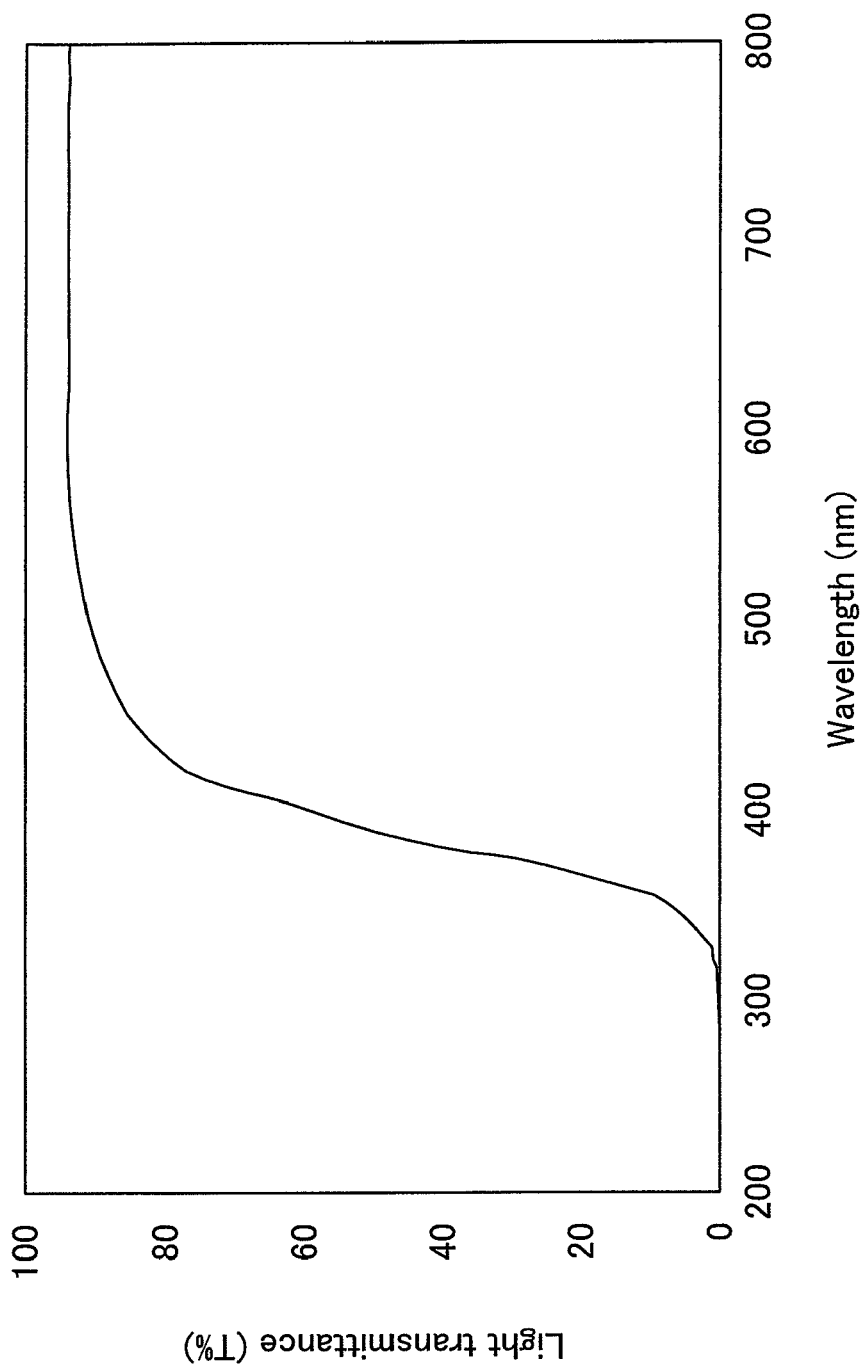
FIG. 5 shows a change of light transmittance (%) in relation to wavelength (nm) when light is irradiated to poly(allyletherbiphenyl-pendant)siloxane.

FIG. 5 shows a change of light transmittance (%) in relation to wavelength (nm) when light is irradiated to the synthesized poly(allyletherbiphenyl-pendant)siloxane. As shown in FIG. 5, the measured light transmittance of the poly(allyletherbiphenyl-pendant)siloxane was 96% for light of 460 nm in wavelength emitted from a general-purpose royal-blue LED. That is, it can be said that the synthesized poly(allyletherbiphenyl-pendant)siloxane is a very transparent polymer and suitably usable as a material of the encapsulant material 15.

Relative Light Output Measurement of the Light-Emitting Device 1 Using an Encapsulant Material Made from the poly(allyletherbiphenyl-pendant)siloxane Table 3 shows a total of luminous quantities measured with only the LED chip 11, not the lens frame 14 and encapsulant material, mounted on the light-emitting device 1 (product Nos. 1 and 2) and a total of luminous quantities measured with the LED chip 11, lens frame 14 and poly(allyletherbiphenyl-pendant)siloxane-made encapsulant material mounted on the device 1. As will be known from Table 3, in case the poly(allyletherbiphenyl-pendant)siloxane was used as the sealing material, the relative light output was found increased by 192% on the average over that measured with the lens frame 14 and encapsulant material 15 not mounted on the device 1, namely, with only the LED chip 11 mounted.

TABLE 3

| No. | With only LED chip mounted | LED chip + Lens frame + Encapsulant material | Relative light output increment |
|---|---|---|---|
| 1 | 5.384 | 10.27 | 191% |
| 2 | 5.477 | 10.6 | 193% |
| Ave. | 5.431 | 10.43 | 192% |

Relative Light Output Measurement of the Light-Emitting Device 1 Using an Encapsulant Material Made from the poly(allylcarbazole-pendant)siloxane Table 4 shows a total of luminous quantities measured with only the LED chip 11, not the lens frame 14 and encapsulant material, mounted on the light-emitting device 1 (product Nos. 1 and 2) and a total of luminous quantities measured with the LED chip 11, lens frame 14 and poly(allylcarbazole-pendant)siloxane-made encapsulant material mounted on the device 1. As will be known from Table 4, in case the poly(allylcarbazole-pendant)siloxane was used as the sealing material, the relative light output was found increased by 197% on the average over that measured with the lens frame 14 and encapsulant material 15 not mounted on the device 1, namely, with only the LED chip 11 mounted.

TABLE 4

| No. | With only LED chip mounted | LED chip + Lens frame + Encapsulant material | Relative light output increment |
|---|---|---|---|
| 1 | 5.384 | 10.673 | 198% |
| 2 | 5.477 | 10.662 | 195% |
| Ave. | 5.431 | 10.667 | 197% |

Namely, for the light-emitting device 1 according to this embodiment, it is possible to provide an LED being heat-resistant and having a high refractive index while keeping transparency by using, as the encapsulant material, the polysiloxane having a functional group introduced in the side chain thereof as mentioned above. More specifically, in the structure with the high refractive-index units introduced in the siloxane skeleton via the hydrosilylation, the light resistance and heat resistance can be kept irrespectively of the high refractive-index units because there are no ester bonds and hydroxy group which will cause the polymer being turned yellow when the encapsulant material is exposed to light and heat and the association of the high refractive-index units is inhibited by the siloxane main chain.

Also in the light-emitting device 1 according to this embodiment, the siloxane skeleton of the polymer leads to a lower glass transition temperature Tg, so that it is possible to prevent the wire from being broken and the encapsulant material from being cracked.

In the foregoing, the present invention has been described in detail concerning certain preferred embodiments thereof as examples with reference to the accompanying drawings. However, it should be understood by those ordinarily skilled in the art that the present invention is not limited to the embodiment but can be modified in various manners, constructed alternatively or embodied in various other forms without departing from the scope and concept thereof as set forth and defined in the appended claims.

In the aforementioned embodiment, the light-emitting device 1 includes a single LED chip 11. However, the light-emitting device 1 according to an embodiment of the present invention may include a plurality of LED chips in the LED device. In this case, the member 16, encapsulant material 15, lens frame 14, etc. may be provided for each of the plural LED chips. Alternatively, a common member 16, encapsulant material 15, lens frame 14, etc. may be provided for all the plural LED chips.

Also, the light-emitting device is not limited to one shown in FIG. 3 but may be constructed in various other forms without departing from the scope and concept thereof as set forth and defined in the appended claims.

According to an embodiment of the present invention, it is possible to provide an optical component encapsulant material having relative high light output, color fastness, heat resistance, and a light-emitting device using the same.

The invention claimed is:

1. A LED light-emitting device comprising:
a light-emitting element; and
an encapsulant material sealing the light-emitting element, wherein the encapsulant material having one or more kinds of units given by the following formula (1) and a refractive index of 1.55 to 1.65:

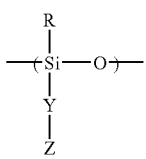
(1)

where R is a hydrogen atom, alkyl group or phenyl group, Y is an alkyl group of which the carbon number is 1 to 6 or an alkyloxy group of which the carbon number is 1 to 6 and Z is one of functional groups given by the following formulas (2), (3), and (5) to (7) in which Z can be bonded to Y in all possible positions:

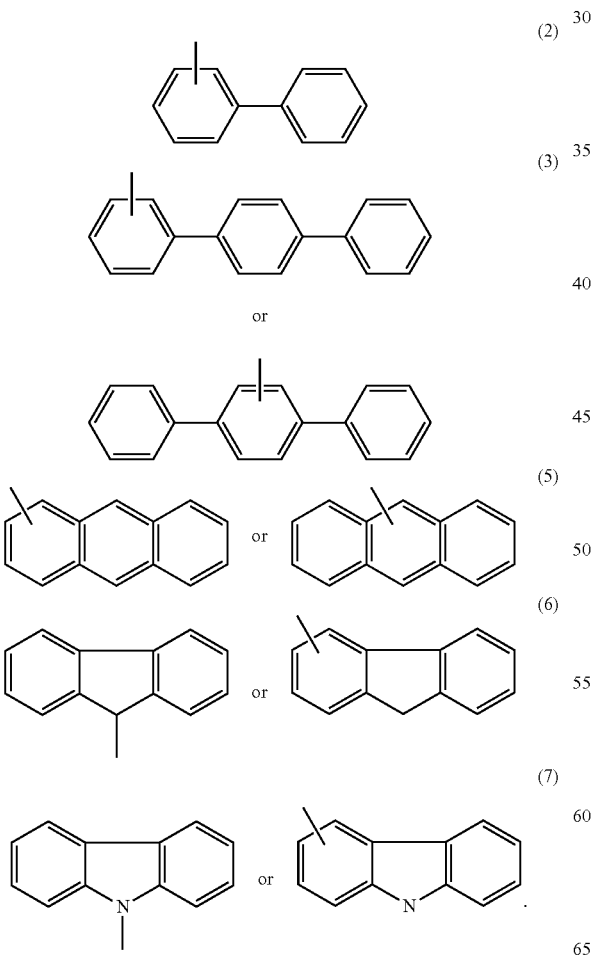

2. The LED light-emitting device according to claim 1, wherein the light-emitting element has an InGaN layer mounted on a substrate.

3. The LED light-emitting device according to claim 1, wherein Y is —CH$_2$—CH$_2$—CH$_2$— or —CH$_2$—CH$_2$—CH$_2$—O—.

4. An optical component encapsulant material for an LED made from a polymer having one or more kinds of units given by the following formula (1) and a refractive index of 1.56, wherein the polymer is a polymethyl(alkyletherbiphenyl-pendant)siloxane:

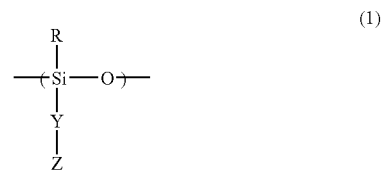
(1)

where R is a hydrogen atom, alkyl group or phenyl group, Y is an alkyl group of which the carbon number is 1 to 6 or an alkyloxy group of which the carbon number is 1 to 6, wherein the Z is the functional group given by the formula (2) in which Z can be bonded to Y in all possible positions:

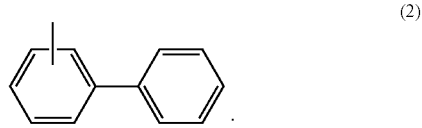
(2)

5. The optical component encapsulant material for a LED according to claim 4, wherein Y is —CH$_2$—CH$_2$—CH$_2$—O—.

6. The LED light-emitting device according to claim 1,
wherein the polymer is a polymethyl(alkyletherbiphenyl-pendant)siloxane,
wherein the refractive index is 1.56, and
wherein the Z is the functional group given by the formula (2).

7. The LED light-emitting device according to claim 6, wherein the Y is —CH$_2$—CH$_2$—CH$_2$—O—.

8. The LED light-emitting device according to claim 1,
wherein the polymer is a polymethyl(alkylcarbazole-pendant)siloxane,
wherein the refractive index is 1.64, and
wherein the Z is the functional group given by the following formula:

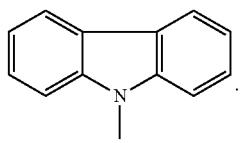

9. The LED light-emitting device according to claim 8, wherein the Y is —CH$_2$—CH$_2$—CH$_2$—.

* * * * *